(12) United States Patent
Lee et al.

(10) Patent No.: US 12,730,479 B2
(45) Date of Patent: Sep. 8, 2026

(54) FOLDABLE DISPLAY DEVICE

(71) Applicant: LG Display Co., Ltd., Seoul (KR)

(72) Inventors: Seonghyeon Lee, Goyang-si (KR); Minwoo Jeon, Busan (KR); Jungmin Lee, Seoul (KR); Hyejeong Park, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 340 days.

(21) Appl. No.: 18/534,515

(22) Filed: Dec. 8, 2023

(65) Prior Publication Data

US 2024/0201742 A1 Jun. 20, 2024

(30) Foreign Application Priority Data

Dec. 19, 2022 (KR) ........................ 10-2022-0178225

(51) Int. Cl.

| | |
|---|---|
| ***G06F 1/16*** | (2006.01) |
| ***H10K 59/126*** | (2023.01) |
| ***H10K 77/10*** | (2023.01) |
| ***H10K 102/00*** | (2023.01) |

(52) U.S. Cl.

CPC ......... *G06F 1/1652* (2013.01); *H10K 59/126* (2023.02); *H10K 77/111* (2023.02); *H10K 2102/311* (2023.02); *H10K 2102/351* (2023.02)

(58) Field of Classification Search

CPC .. G06F 1/1652; H10K 59/126; H10K 77/111; H10K 2102/311; H10K 2102/351; H10K 50/865; H10K 59/38; H10K 59/8792; H10K 59/873; H10K 50/841; H10K 50/844; H10K 59/87; G09F 9/301; G02B 5/003; G02B 5/206; G02B 5/22; G02B 5/223

See application file for complete search history.

(56) References Cited

U.S. PATENT DOCUMENTS

| | | | | |
|---|---|---|---|---|
| 2008/0218064 | A1* | 9/2008 | Cho | H10K 59/38 313/504 |
| 2020/0088916 | A1* | 3/2020 | Nagahama | G03B 9/02 |
| 2021/0385314 | A1* | 12/2021 | An | H04M 1/0264 |
| 2022/0208904 | A1* | 6/2022 | Lee | H10K 59/122 |
| 2022/0347976 | A1* | 11/2022 | Masuyama | B32B 17/10935 |

FOREIGN PATENT DOCUMENTS

KR 10-2010-0102788 A 9/2010

* cited by examiner

*Primary Examiner* — Stephone B Allen
*Assistant Examiner* — Adam W Booher
(74) *Attorney, Agent, or Firm* — Fenwick & West LLP

(57) ABSTRACT

A foldable display device includes a display panel including a display area and a non-display area, wherein the display panel includes a light-emitting element, an encapsulation layer disposed on the light-emitting element, and color filters disposed on the encapsulation layer; and a cover window assembly disposed on the display panel, wherein the cover window assembly includes a protective film and a multi-functional layer disposed under the protective film, wherein the multi-functional layer includes: a light-transmissive portion overlapping the display area of the display panel; and a light-blocking portion overlapping both the display area and the non-display area of the display panel, wherein the light-blocking portion has a light-transmittance lower than a light-transmittance of the light-transmissive portion.

20 Claims, 5 Drawing Sheets

FOLDABLE DISPLAY DEVICE

CROSS-REFERENCE TO RELATED APPLICATION

This application claims priority from Republic of Korea Patent Application No. 10-2022-0178225 filed on Dec. 19, 2022 in the Korean Intellectual Property Office, and all the benefits accruing therefrom under 35 U.S.C. 119, which is hereby incorporated by reference in its entirety.

BACKGROUND

Field

The present disclosure relates to a foldable display device. More specifically, the present disclosure relates to a foldable display device in which reflection of external light is reduced, and puncture strength is improved.

Description of Related Art

There are various types of display devices that display images, such as a liquid crystal display device (LCD), an organic light-emitting diode display device (OLED), an inorganic light-emitting diode display device (ILED), a quantum dot display device (QD), and an electrophoretic display device (EPD).

Recently, a foldable display device in which a display panel is foldable or is unfolded has been developed to satisfy both a large screen and portability.

A polarizer is disposed on the display panel of the foldable display device to reduce reflection of external light. However, since luminance of the display device is lowered due to the presence of the polarizer, power consumption should increase to improve the luminance. Thus, a foldable display device capable of reducing the reflection of external light while being free of the polarizer is being developed.

SUMMARY

When the polarizer is not used, there is an advantage of reducing power consumption, while there is a problem in that a puncture strength of the foldable display device is reduced and reflection of external light is increased.

The display device does not adopt the polarizer, but employs a black bank to distinguish light-emitting areas of sub-pixels from the each other and includes a black matrix disposed between color filters, such that the reflection of external light of the display panel of the light-emitting display device may be significantly reduced. However, reflection of the external light from the black matrix surface and reflection of the external light from a surface of the color filters still occur.

Thus, the inventors of the present disclosure have invented a flexible cover window in which puncture strength can be improved while reflection of external light can be reduced.

A technical purpose according to an embodiment of the present disclosure is to provide a foldable display device including a flexible cover window capable of improving puncture strength while reducing reflection of external light.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

A foldable display device according to an embodiment of the present disclosure may be provided. The foldable display device includes a display panel including a display area and a non-display area, wherein the display panel includes a light-emitting element, an encapsulation layer disposed on the light-emitting element, and color filters disposed on the encapsulation layer; and a cover window assembly disposed on the display panel, wherein the cover window assembly includes a protective film and a multi-functional layer disposed under the protective film, wherein the multi-functional layer includes: a light-transmissive portion overlapping the display area of the display panel; and a light-blocking portion overlapping both the display area and the non-display area of the display panel, wherein the light-blocking portion has a light-transmittance lower than a light-transmittance of the light-transmissive portion.

A foldable display device according to another embodiment of the present disclosure may be provided. The foldable display device includes a display panel including a light-emitting element, an encapsulation layer disposed on the light-emitting element, and color filters disposed on the encapsulation layer; a protective film disposed on the display panel; and a multi-functional layer disposed between the protective film and the display panel, wherein the multi-functional layer is attached to an upper surface of the display panel, wherein the multi-functional layer includes: a light-transmissive portion having an area size smaller than an area size of the display panel; and a light-blocking portion covering at least one of a lower surface or an upper surface of the light-transmissive portion, and side surfaces of the light-transmissive portion, wherein the light-blocking portion has a light-transmittance lower than a light-transmittance of the light-transmissive portion.

Details of other embodiments are included in the detailed descriptions and drawings.

According to the embodiments of the present disclosure, the multi-functional layer including the thermoplastic elastomer may be disposed under the protective film, such that the puncture strength of the foldable display device may be improved.

According to the embodiments of the present disclosure, the multi-functional layer may include the light-transmissive portion overlapping the display area of the display panel, and the light-blocking portion overlapping both the display area and the non-display area of the display panel and having the lower light-transmittance than that of the light-transmissive portion. Thus, external light reflection of the foldable display devices may be reduced.

According to the embodiments of the present disclosure, the multi-functional layer having the outer light-blocking portion corresponding to the non-display area of the display panel may be directly attached to the upper surface of the display panel. Thus, the foldable display device having a narrow bezel may be implemented.

According to the embodiments of the present disclosure, a material for reducing reflection of external light and a material for preventing lines in the non-display area of the display panel from being viewed to the outside may be unified and may be integrated into the multi-functional layer. Thus, a manufacturing process of the foldable display device may be simplified and a manufacturing time thereof may be reduced.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

DETAILED DESCRIPTION

Figure 1:
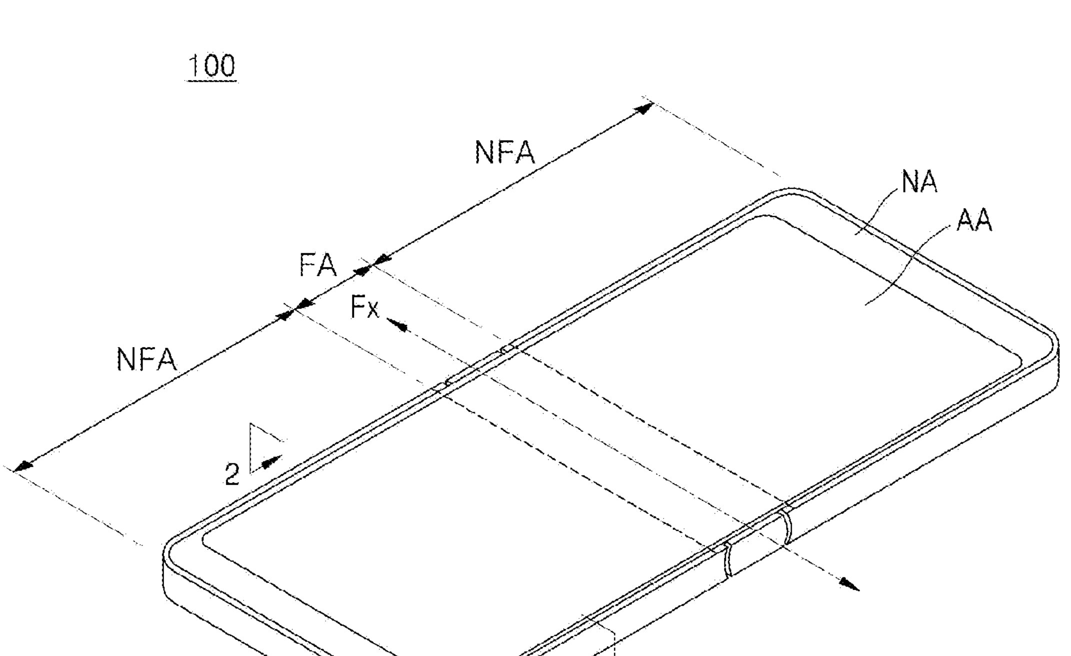
FIG. 1 is a perspective view showing a foldable display device according to one embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included in the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Description.

Hereinafter, foldable display devices according to embodiments according to the present disclosure will be described in detail with reference to the accompanying drawings.

FIG. 1 is a perspective view showing a foldable display device according to an embodiment of the present disclosure.

Referring to FIG. 1, a foldable display device 100 according to the present disclosure may include a display area AA, a non-display area NA, a foldable area FA, and a non-foldable area NFA.

The display area AA may be an area where an image is displayed. The non-display area NA may be disposed around the display area AA and may be an area in which an image is not displayed. The foldable area FA may contain a folding axis Fx and may overlap a portion of the display area AA and a portion of the non-display area NA. For example, the foldable area FA may be an area in which the display device is folded at a predetermined curvature when the foldable display device 100 is folded in at least one of inner folding and outer folding schemes. An area other than the foldable area FA may be the non-foldable area NFA. The non-foldable area NFA may overlap a portion of the display area AA and a portion of the non-display area NA.

In addition, the foldable display device 100 may further include a hinge structure for folding the display panel and a casing for supporting and accommodating therein the display panel. The display area AA, the non-display area NA, the foldable area FA, and the non-foldable area NFA may be equally or similarly applied to each of components of the foldable display device 100.

Figure 2:
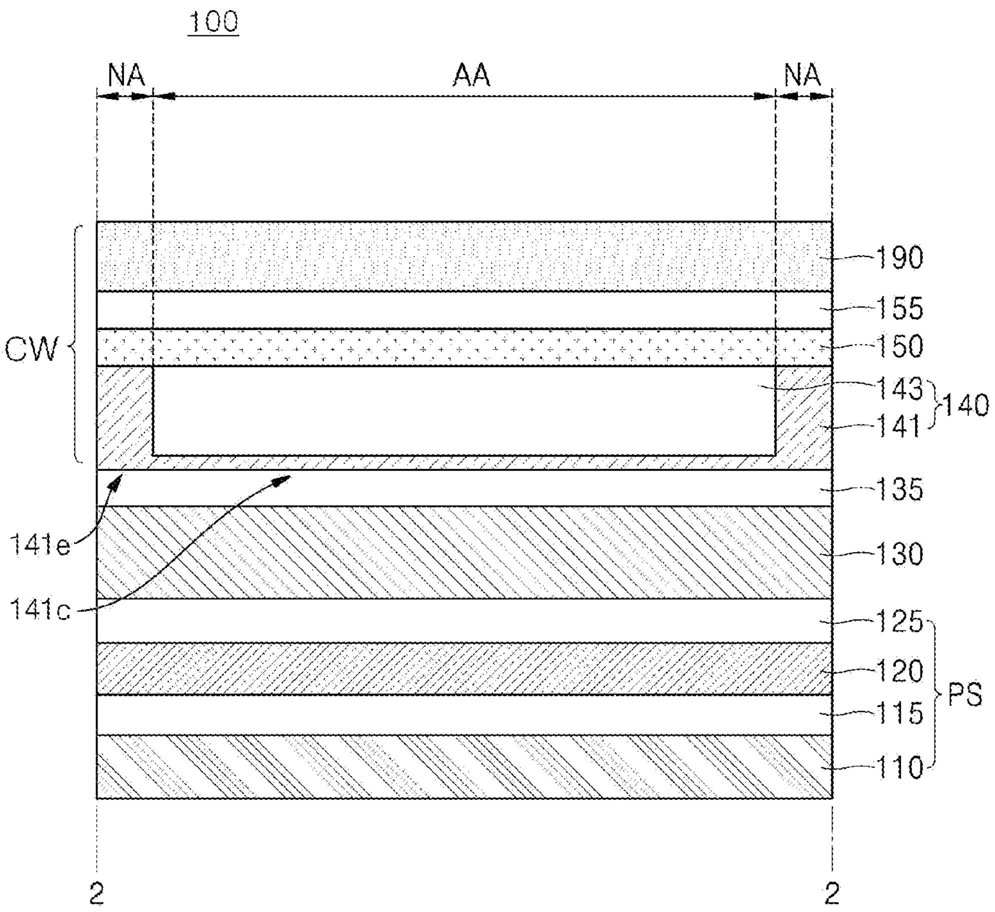
FIG. 2 is a cross-sectional view showing a foldable display device according to one embodiment of the present disclosure.

FIG. 2 is a cross-sectional view showing a foldable display device according to embodiments of the present disclosure.

Referring to FIG. 2, the foldable display device 100 according to an embodiment of the present disclosure includes a support structure PS, a display panel 130, and a cover window assembly CW.

The cover window assembly CW may be disposed on the display panel 130. The cover window assembly CW may protect the display panel 130 from external impact, moisture, and heat.

The support structure PS may be disposed under the display panel 130 to support the display panel 130 and may release heat generated from the display panel 130 to the outside.

The cover window assembly CW may include a multi-functional layer 140, a cover window 150, and a protective film 190.

The cover window 150 may be made of a tempered glass or a plastic film having impact resistance and light transmission in order to protect the display panel 130 from external impact, moisture, and heat. In order to satisfy strength characteristics and folding characteristics, the cover window 150 may be formed to have a thickness of 30 μm to 200 μm.

When the cover window 150 is made of the plastic film, the plastic film may include polyimide (PI), polyethylene terephthalate (PET), polypropylene glycol (PPG), or polycarbonate (PC). However, the present disclosure is not limited thereto.

When the cover window 150 is made of the tempered glass, the cover window 150 may be broken by external force or stress. In this regard, in order to prevent fragments of the cover window 150 from scattering, the protective film 190 may be attached to an upper surface of the cover window 150 via an adhesive layer 155.

The protective film 190 may include, for example, polyethylene terephthalate (PET), colorless polyimide (CPI), or a laminate of polyethylene terephthalate (PET) and transparent polyimide (CPI).

A hard coating layer may be formed on the protective film 190. The hard coating layer may include a transparent organic-inorganic composite material. An anti-fingerprint layer may be further formed on the protective film 190.

The adhesive layer 155 may be transparent and may be made of a pressure-sensitive adhesive (PSA) including an optical clear adhesive (OCA).

The multi-functional layer 140 may be disposed on a lower surface of the cover window 150. The multi-functional layer 140 may be directly coated on the lower surface of the cover window 150.

In consideration of the folding characteristics, the multi-functional layer 140 may be formed to have a thickness of 50 μm to 120 μm. The multi-functional layer 140 may include, for example, a polymer material having a storage modulus in a range of 1 MPa to 1 GPa. In this regard, the storage modulus is a value measured at 25° C. The multi-functional layer 140 may include, for example, a thermoplastic elastomer such as thermoplastic polyurethane (TPU).

Additionally placing the multi-functional layer 140 between the cover window 150 and the display panel 130 may allow the puncture strength of the foldable display device 100 to be improved. Further, additionally placing the multi-functional layer 140 between the cover window 150 and the display panel 130 may allow a compressive stress applied to an upper portion of the display panel 130 during a folding operation to be reduced. Accordingly, even when the folding and unfolding operations of the foldable display device 100 are repeated, a defect that an organic light-emitting layer in the display panel 130 is detached may be reduced.

The multi-functional layer 140 may include a light-transmissive portion 143 overlapping the display area AA of the display panel 130, and a light-blocking portion 141 overlapping both the display area AA and the non-display area NA of the display panel 130 and having a lower light-transmittance than that of the light-transmissive portion 143. The multi-functional layer 140 may include the light-transmissive portion 143 directly disposed on or in contact with the lower surface of the cover window 150, and the light-blocking portion 141 covering side surfaces and a lower surface of the light-transmissive portion 143. The light-transmissive portion 143 may have a smaller area than that of the display panel 130.

The light-transmissive portion 143 may be transparent, and the light-blocking portion 141 may be colored and opaque. A black pigment or dye may be contained in the light-blocking portion 141. A combination of a red pigment or dye, a blue pigment or dye, and a green pigment or dye may be contained in the light-blocking portion 141 to render a black color. A combination of pigments or dyes of various colors may be contained in the light-blocking portion 141 to render the black color.

For example, the light-transmissive portion 143 may be made of transparent thermoplastic polyurethane, and the light-blocking portion 141 may be made of opaque thermoplastic polyurethane. The light-blocking portion 141 may be made of black or dark gray thermoplastic polyurethane.

The light-blocking portion 141 may include an inner light-blocking portion 141*c* disposed on a lower surface of the light-transmissive portion 143, and an outer light-blocking portion 141*e* surrounding the side surfaces of the light-transmissive portion 143.

The inner light-blocking portion 141*c* of the light-blocking portion 141 overlaps the display area AA of the display panel 130. The light emitted from the display area AA of the display panel 130 should pass through the inner light-blocking portion 141*c* of the light-blocking portion 141 and then be emitted to the outside. Thus, the light-transmittance of the inner light-blocking portion 141*c* may be greater than the light-transmittance of the outer light-blocking portion 141*e*. A content of the pigment or dye contained in the inner light-blocking portion 141*c* may be smaller than a content of the pigment or dye contained in the outer light-blocking portion 141*e*. The content of the pigment or dye contained in the inner light-blocking portion 141*c* may be in a range of 0.05 wt % to 2 wt %, while the content of the pigment or dye contained in the outer light-blocking portion 141*e* may be in range of 0.5 wt % to 5 wt %.

The inner light-blocking portion 141*c* of the light-blocking portion 141 may transmit therethrough about 50% to 80% of the light directly emitted from the display panel 130 or the external light reflected from the display panel 130. Accordingly, the inner light-blocking portion 141*c* of the light-blocking portion 141 may reduce reflection of the external light from the display panel 130. In addition, a color of light reflected from the display panel 130 may be adjusted by adjusting a ratio of contents of the pigments of various colors contained in the inner light-blocking portion 141*c* of the light-blocking portion 141.

The outer light-blocking portion 141*e* of the light-blocking portion 141 overlaps the non-display area NA of the display panel 130, and may prevent a driver circuit, various lines, and a pad of the non-display area NA of the display panel 130 from being visible to the outside. The outer light-blocking portion 141*e* of the light-blocking portion 141 may have a ring shape surrounding the inner light-blocking portion 141*c* of the light-blocking portion 141 in a top view of the display device. The outer light-blocking portion 141*e* of the light-blocking portion 141 may include two layers having different contents of pigments or dyes. At least one layer of the outer light-blocking portion 141*e* of the light-blocking portion 141 may have the same pigment or dye content as that in the inner light-blocking portion 141*c*.

As shown in FIG. 2, as the outer light-blocking portion 141*e* surrounds side surfaces of the light-transmissive portion 143, a thickness of the outer light-blocking portion 141*e* may be larger than a thickness of the inner light-blocking portion 141*c*. The thickness of the inner light-blocking portion 141*c* may be smaller than a thickness of the light-transmissive portion 143, but the disclosure is not limited thereto.

The thickness of the outer light-blocking portion 141*e* may be in a range of 50 μm to 120 μm, and the thickness of the inner light-blocking portion 141*c* may be in a range of 0.5 μm to 10 μm, but the disclosure is not limited thereto.

The light-blocking portion 141 of the multi-functional layer 140 may be attached to an upper surface of the display panel 140 via an adhesive layer 135. The adhesive layer 135 may be transparent and may be made of a pressure-sensitive adhesive (PSA) including an optical clear adhesive (OCA).

The display panel 130 may display an image. The display panel 130 may be flexible. For example, the display panel 130 may be embodied as an organic light-emitting diode display panel. However, the present disclosure is not necessarily limited thereto. The display panel 130 may be embodied as an inorganic light-emitting diode display panel, a liquid crystal display panel, an electrophoretic display panel, or the like.

Figure 3:
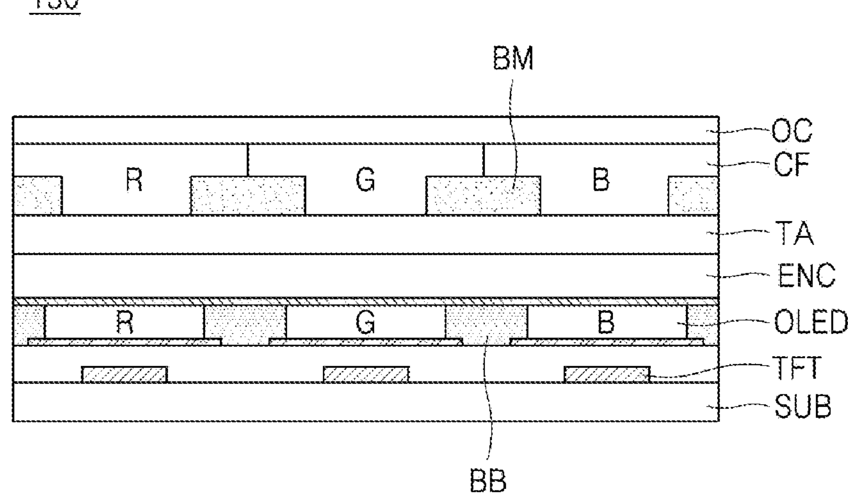
FIG. 3 is a schematic cross-sectional view of a display panel of a foldable display device according to one embodiment of the present disclosure.

Referring to FIG. 3, when the display panel 130 is embodied as the organic light-emitting diode display panel, the display panel 130 may include a thin-film transistor TFT disposed in each sub-pixel and on a flexible substrate SUB, an organic light-emitting element OLED disposed in each sub-pixel and connected to the thin-film transistor, and an encapsulation layer ENC that covers the emitting elements OLED so as to prevent the penetration of moisture and oxygen from the outside into the emitting elements OLED. In one example, each of the organic light-emitting elements (OLED) may be configured to emit each of red light, green light, and blue light in each sub-pixel, or may be configured to emit white light in each sub-pixel. Each of the organic light-emitting elements OLED may include an anode electrode, an organic light-emitting layer, and a cathode electrode. The organic light-emitting elements OLED may be spaced apart from each other by a bank BB. The bank BB may cover a portion of a side end of the anode electrode. The bank BB may be embodied as a black bank containing black pigments or dyes. Further, the display panel 130 may further include a touch electrode array TA formed on the encapsulation layer ENC, color filters CF formed on the touch electrode array TA, a black matrix BM disposed between adjacent color filters, and an overcoat layer OC covering the color filters CF. The color filters CF include red color filter R, green color filter G, and blue color filter B. The black matrix BM may be disposed so as to overlap the bank BB and may have a width larger than that of the bank BB. Touch electrodes of the touch electrode array TA may be disposed so as to overlap the black matrix BM.

The support structure PS may include aback plate 120 and a support plate 110. Further, the support structure PS may include an adhesive layer 115 disposed between the back plate 120 and the support plate 110, and an adhesive layer 125 disposed on the back plate 120.

The back plate 120 may be disposed under the display panel 130 and support the display panel 130. The display panel 130 applied to the foldable display device 100 may be very thin and flexible. The back plate 120 may prevent or at least reduce a foreign material from being attached to a lower surface of the display panel 130, and reinforce rigidity of the display panel 130 and may absorb an impact applied from the outside. The back plate 120 may be embodied as a polymer film. The polymer film which the back plate 120 may be embodied as may be made of, for example, polyimide, (PI), polyethylene terephthalate (PET), polycarbonate (PC), polyethylene naphthalate (PEN). However, the present disclosure is not limited thereto.

The adhesive layer 125 may be disposed between the back plate 120 and the display panel 130. The back plate 120 may be attached to the lower surface of the display panel 130 via the adhesive layer 125. The adhesive layer 125 may be transparent and may be made of a pressure-sensitive adhesive (PSA) including an optical clear adhesive (OCA).

The support plate 110 may facilitate folding and unfolding of the display panel 130. The support plate 110 may dissipate the heat generated from the display panel 130 to the outside. The support plate 110 may be attached to the lower surface of the back plate 120 via the adhesive layer 115. The adhesive layer 115 may be transparent and may be made of a pressure-sensitive adhesive (PSA) including an optical clear adhesive (OCA).

The support plate 110 may include at least one support plate and at least one adhesive layer. The support plate 110 may include a first support plate and a second support plate. The support plate 110 may further include an adhesive layer disposed between the first support plate and the second support plate. The first support plate may act as a lower support plate, and the second support plate may act as an upper support plate.

Figure 4:
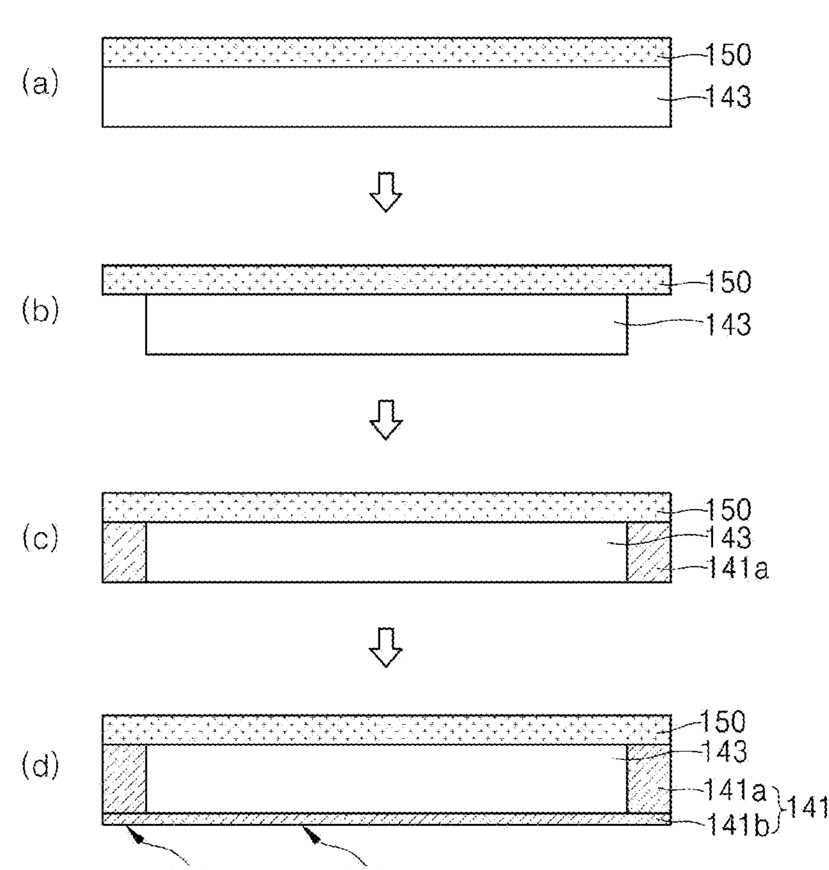
FIG. 4 is a cross-sectional view showing a method of forming a multi-functional layer according to one embodiment of the present disclosure.

FIG. 4 is a cross-sectional view showing a method of forming a multi-functional layer according to one embodiment of the present disclosure.

Referring to part (a) in FIG. 4, first, an entire lower surface of the cover window 150 may be coated with the light-transmissive portion 143. The light-transmissive portion 143 may be made of a transparent thermoplastic elastomer. The light-transmissive portion 143 may be made of, for example, transparent thermoplastic polyurethane.

Referring to part (b) of FIG. 4, an edge of the light-transmissive portion 143 may be removed by an etching process. The edge of the light-transmissive portion 143 may be removed by a width corresponding to a bezel area or the non-display area of the display device.

Referring to part (c) of FIG. 4, a first light-blocking layer **141*a* may be coated on a side surface of the light-transmissive portion 143. The first light-blocking layer 141*a* may be made of, for example, thermoplastic elastomer containing black pigment or dye. The first light-blocking layer 141*a*** may be made of, for example, thermoplastic polyurethane containing the black pigment or dye at a content of 0.5 wt % to 5 wt %.

Referring to part (d) in FIG. 4, a second light-blocking layer **141*b* may be coated on a lower surface of the light-transmissive portion 143 and a lower surface of the first light-blocking layer 141*a*. The second light-blocking layer 141*b* may be made of, for example, a thermoplastic elastomer containing black pigment or dye at a smaller content than that in the first light-blocking layer 141*a*. The second light-blocking layer 141*b*** may be made of, for example, thermoplastic polyurethane containing the black pigment or dye at a content of 0.05 wt % to 2 wt %.

The inner light-blocking portion **141*c* of the light-blocking portion 141 may include only the second light-blocking layer 141*b*, while the outer light-blocking portion 141*e* of the light-blocking portion 141 may have a structure in which the first light-blocking layer 141*a* and the second light-blocking layer 141*b* are stacked. That is, the outer light-blocking portion 141*e* of the light-blocking portion 141** may include two layers having different contents of pigments or dyes.

Figure 5:
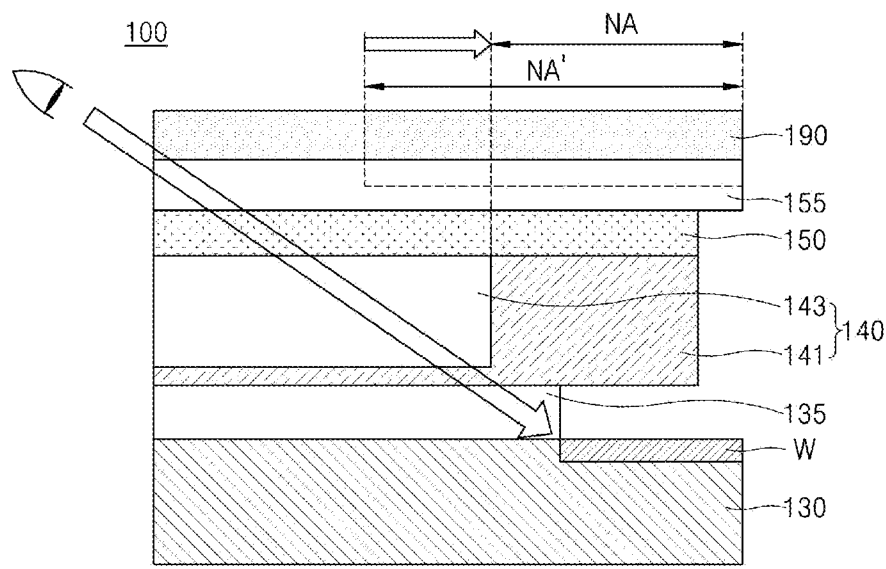
FIG. 5 is a cross-sectional view showing a non-display area of a foldable display device according to one embodiment of the present disclosure.
Figure 6:
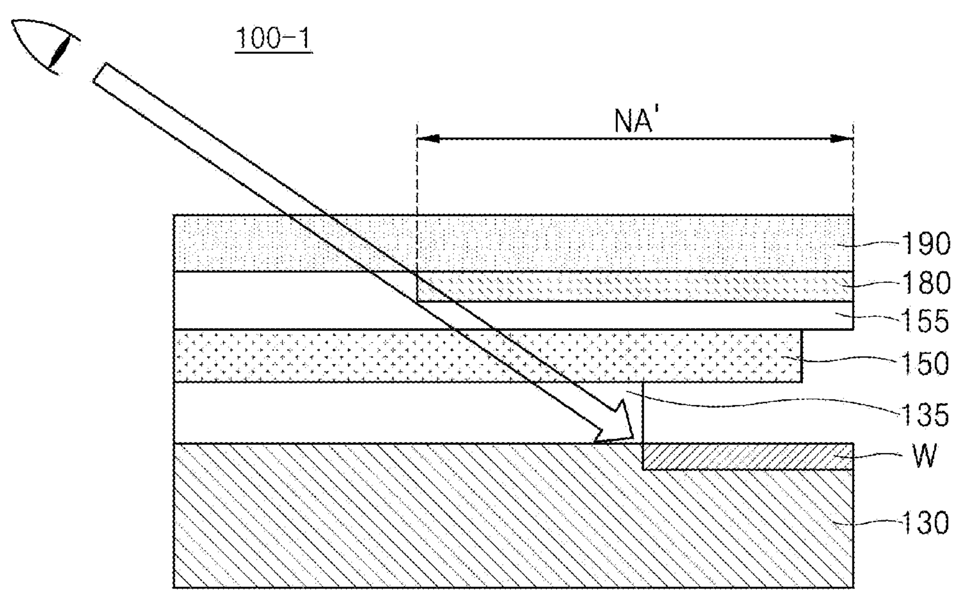
FIG. 6 is a cross-sectional view showing a non-display area of a foldable display device according to a comparative example.

FIG. 5 is a cross-sectional view showing a non-display area of the foldable display device 100 according to one embodiment of the present disclosure. FIG. 6 is a cross-sectional view showing a non-display area of a foldable display device 100-1 according to a comparative example.

Referring to FIG. 5 and FIG. 6 together, it may be understood that a width of the non-display area NA, that is, a width of the bezel area, of the foldable display device 100 according to one embodiment of the present disclosure may be reduced. For better understanding, FIG. 5 shows a width of a non-display area NA' of the foldable display device 100-1 according to the comparative example of FIG. 6.

Referring to FIG. 6, in the foldable display device 100-1 according to the comparative example, a cover window 150 is attached to the upper surface of the display panel 130 via the adhesive layer 135, and a protective film 190 is attached to the cover window 150 via the adhesive layer 155. A black matrix 180 is disposed on an edge of a lower surface of the protective film 190. Lines W are disposed in the non-display area of the display panel 130. In order to prevent these lines W from being visible to the outside, the black matrix 180 disposed on the lower surface of the protective film 190 has a predetermined width. The width of the black matrix 180 determines the width of the non-display area NA' of the foldable display device 100-1, that is, the width of the bezel area thereof.

Referring to FIG. 5, in the foldable display device 100 according to one embodiment of the present disclosure, the multi-functional layer 140 is attached onto the upper surface of the display panel 130 via the adhesive layer 135. The outer light-blocking portion 141*e* is spaced from the non-display area of the display panel 130 by a spacing equal to a thickness of the adhesive layer 135. Therefore, in order to prevent the lines W of the non-display area of the display panel 130 from being visible to the outside, the outer light-blocking portion 141*e* may be formed to have a width smaller than a width of the black matrix 180 of the display device 100-1 according to the comparative example. Accordingly, a width of the non-display area NA of the foldable display device 100 according to one embodiment of the present disclosure may be smaller than the width of the non-display area NA' of the foldable display device 100-1 according to the comparative example. The foldable display device 100 according to this embodiment may implement a narrow bezel.

Figure 7:
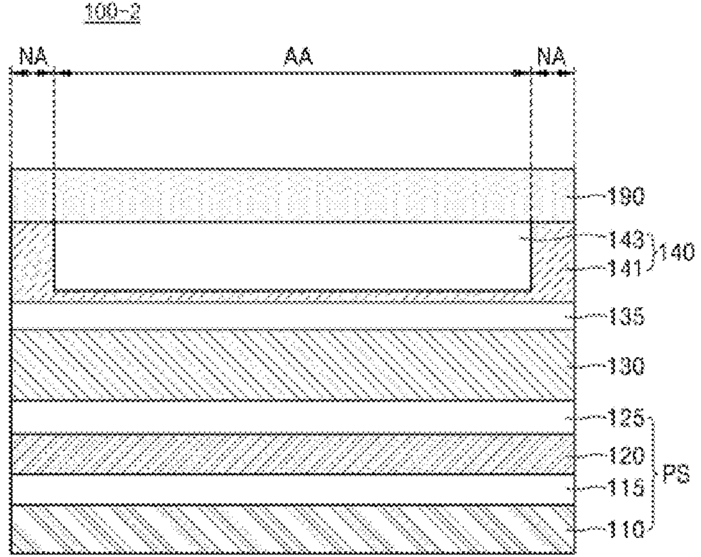
FIG. 7 is a cross-sectional view showing a foldable display device according to one embodiment of the present disclosure.

FIG. 7 is a cross-sectional view showing a foldable display device 100-2 according to one embodiment of the present disclosure.

Referring to FIG. 7, unlike FIG. 2, in this embodiment, the cover window 150 may be absent and the multi-functional layer 140 may be directly disposed on a lower surface of the protective film 190. Accordingly, the light-transmissive portion 143 of the multi-functional layer 140 may be directly disposed on or in contact with the lower surface of the protective film 190. The light-blocking portion 141 may cover the lower and side surfaces of the light-transmissive portion 143. In this embodiment, since there is no cover window 150, a thickness of the multi-functional layer 140 may be larger than that of the multi-functional layer 140 of the embodiment of FIG. 2.

The multi-functional layer 140 may be attached onto the display panel 130. Thus, the reflection of the external light of the foldable display device 100-2 according to this embodiment may be reduced, and the puncture strength thereof may be improved, and the narrow bezel may be implemented.

Figure 8:
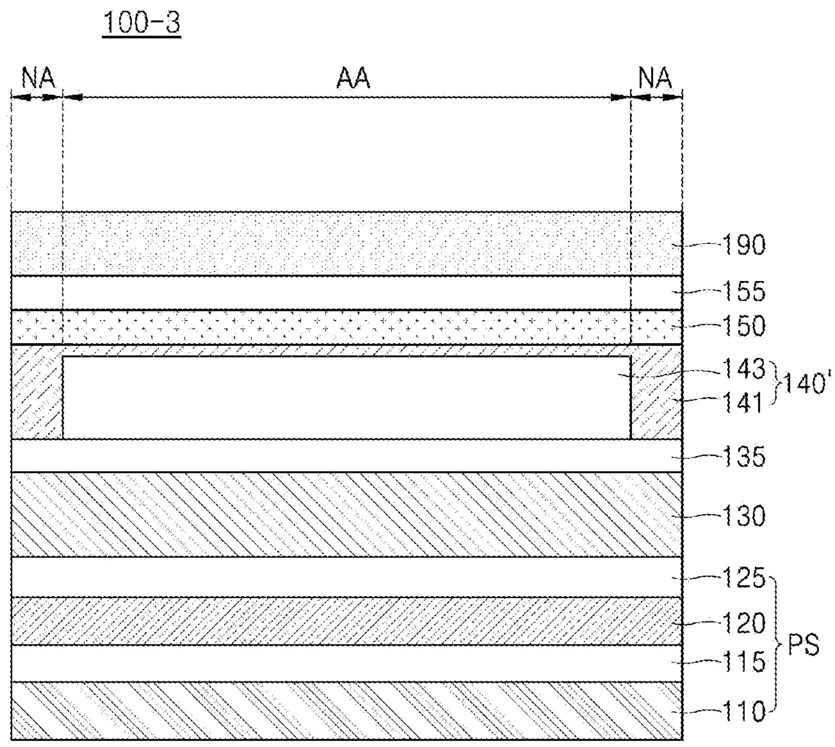
FIG. 8 is a cross-sectional view showing a foldable display device according to one embodiment of the present disclosure.

FIG. 8 is a cross-sectional view showing a foldable display device 100-3 according to one embodiment of the present disclosure.

Referring to FIG. 8, unlike FIG. 2, in this embodiment, a multi-functional layer 140' may be disposed on a lower surface of the cover window 150. The multi-functional layer 140' may include the light-blocking portion 141 disposed directly on or in contact with the lower surface of the cover window 150 and the light-transmissive portion 143 whose an upper surface and side surfaces are covered with the light-blocking portion 141. A lower surface of the light-transmissive portion 143 may be attached to the upper surface of the display panel 130 via the adhesive layer 135.

The multi-functional layer 140' may be attached onto the display panel 130. Thus, the reflection of the external light of the foldable display device 100-3 according to this embodiment may be reduced, and the puncture strength thereof may be improved, and the narrow bezel may be implemented.

In a similar manner to FIG. 7, in one embodiment, the multi-functional layer 140' may be directly disposed on the lower surface of the protective film 190 while the cover window 150 may be absent. Accordingly, the light-blocking portion 141 of the multi-functional layer 140' may be directly disposed on or contact the lower surface of the protective film 190. The light-blocking portion 141 may cover the upper and side surfaces of the light-transmissive portion 143. In this case, since there is no cover window 150, the thickness of the multi-functional layer 140' may be larger than that of the multi-functional layer 140' in the embodiment of FIG. 8.

In some embodiments, each of the multi-functional layers 140 and 140' may have the light-blocking portion 141 disposed so as to cover both the upper and lower surfaces of the light-transmissive portion 143. In this case, the content of the pigment or dye contained in the inner light-blocking portion 141*c* of the light-blocking portion 141 may be reduced compared to that in a case where the inner light-blocking portion 141*c* of the light-blocking portion 141 is only disposed on the upper or lower surface of the light-transmissive portion 143.

A foldable display device according to embodiments of the present disclosure may be described as follows.

A first aspect of the present disclosure provides a foldable display device comprising: a display panel including a display area and a non-display area, wherein the display panel includes a light-emitting element, an encapsulation layer disposed on the light-emitting element, and color filters disposed on the encapsulation layer; and a cover window assembly disposed on the display panel, wherein the cover window assembly includes a protective film and a multi-functional layer disposed under the protective film, wherein the multi-functional layer includes: a light-transmissive portion overlapping the display area of the display panel; and a light-blocking portion overlapping both the display area and the non-display area of the display panel, wherein the light-blocking portion has a light-transmittance lower than a light-transmittance of the light-transmissive portion.

In some implementations of the first aspect of the present disclosure, the light-blocking portion includes: an outer light-blocking portion surrounding side surfaces of the light-transmissive portion; and an inner light-blocking portion covering at least one of an upper surface or a lower surface of the light-transmissive portion, wherein a light-transmittance of the inner light-blocking portion is higher than a light-transmittance of the outer light-blocking portion.

In some implementations of the first aspect of the present disclosure, the light-blocking portion includes a thermoplastic elastomer containing a pigment or dye for rendering a black color.

In some implementations of the first aspect of the present disclosure, the light-blocking portion includes a thermoplastic polyurethane containing a black pigment or dye.

In some implementations of the first aspect of the present disclosure, the light-blocking portion includes a thermoplastic polyurethane containing a red pigment or dye, a green pigment or dye, and a blue pigment or dye.

In some implementations of the first aspect of the present disclosure, a content of the pigment or dye contained in the outer light-blocking portion of the light-blocking portion is higher than a content of the pigment or dye contained in the inner light-blocking portion of the light-blocking portion.

In some implementations of the first aspect of the present disclosure, the content of the pigment or dye contained in the outer light-blocking portion of the light-blocking portion is in a range of 0.5 wt % to 5 wt %, wherein the content of the pigment or dye contained in the inner light-blocking portion of the light-blocking portion is in a range of 0.05 wt % to 2 wt %.

In some implementations of the first aspect of the present disclosure, the outer light-blocking portion of the light-blocking portion includes two layers having different contents of the pigments or dye.

In some implementations of the first aspect of the present disclosure, a thickness of the outer light-blocking portion of the light-blocking portion is larger than a thickness of the inner light-blocking portion of the light-blocking portion.

In some implementations of the first aspect of the present disclosure, a thickness of the outer light-blocking portion of the light-blocking portion is in a range of 50 μm to 120 μm, wherein the thickness of the inner light-blocking portion of the light-blocking portion is in a range of 0.5 μm to 10 μm.

In some implementations of the first aspect of the present disclosure, a thickness of the inner light-blocking portion of the light-blocking portion is smaller than a thickness of the light-transmissive portion.

In some implementations of the first aspect of the present disclosure, the multi-functional layer of the cover window assembly is directly coated on a lower surface of the protective film and is attached to an upper surface of the display panel via an adhesive layer.

In some implementations of the first aspect of the present disclosure, the cover window assembly further includes a cover window disposed between the protective film and the multi-functional layer, wherein the multi-functional layer is directly coated on a lower surface of the cover window and is attached to the upper surface of the display panel via an adhesive layer.

A second aspect of the present disclosure provides a foldable display device comprising: a display panel including a light-emitting element, an encapsulation layer disposed on the light-emitting element, and color filters disposed on the encapsulation layer; a protective film disposed on the display panel; and a multi-functional layer disposed between the protective film and the display panel, wherein the multi-functional layer is attached to an upper surface of the display panel, wherein the multi-functional layer includes: a light-transmissive portion having an area size smaller than an area size of the display panel; and a light-blocking portion covering at least one of a lower surface or an upper surface of the light-transmissive portion, and side surfaces of the light-transmissive portion, wherein the light-blocking portion has a light-transmittance lower than a light-transmittance of the light-transmissive portion.

In some implementations of the second aspect of the present disclosure, the light-blocking portion of the multi-functional layer covers the lower and side surfaces of the light-transmissive portion, wherein the light-transmissive portion of the multi-functional layer directly contacts a lower surface of the protective film.

In some implementations of the second aspect of the present disclosure, the light-blocking portion of the multi-functional layer covers the upper and side surfaces of the light-transmissive portion, wherein the light-blocking portion of the multi-functional layer directly contacts a lower surface of the protective film.

In some implementations of the second aspect of the present disclosure, the foldable display device further comprises a cover window disposed between the protective film and the multi-functional layer, wherein the light-blocking portion of the multi-functional layer covers the lower and side surfaces of the light-transmissive portion, wherein the light-transmissive portion of the multi-functional layer directly contacts a lower surface of the cover window.

In some implementations of the second aspect of the present disclosure, the foldable display device further comprises a cover window disposed between the protective film and the multi-functional layer, wherein the light-blocking portion of the multi-functional layer covers the upper and side surfaces of the light-transmissive portion, wherein the light-blocking portion of the multi-functional layer directly contacts a lower surface of the cover window.

In some implementations of the second aspect of the present disclosure, the light-blocking portion includes a thermoplastic elastomer containing a pigment or dye for rendering a black color.

In some implementations of the second aspect of the present disclosure, the light-blocking portion includes: an outer light-blocking portion surrounding side surfaces of the light-transmissive portion; and an inner light-blocking portion covering at least one of an upper surface or a lower surface of the light-transmissive portion, wherein a content of the pigment or dye contained in the outer light-blocking portion of the light-blocking portion is higher than a content of the pigment or dye contained in the inner light-blocking portion of the light-blocking portion.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. A foldable display device comprising:

a display panel including a display area and a non-display area, wherein the display panel includes a light-emitting element, an encapsulation layer on the light-emitting element, and color filters on the encapsulation layer; and a cover window assembly on the display panel, the cover window assembly including a protective film and a multi-functional layer under the protective film, wherein the multi-functional layer includes:

a light-transmissive portion overlapping the display area of the display panel; and a light-blocking portion overlapping both the display area and the non-display area of the display panel, the light-blocking portion having a light-transmittance that is less than a light-transmittance of the light-transmissive portion, wherein the light-blocking portion comprises:

an outer light-blocking portion which is in direct contact with side surfaces of the light-transmissive portion, and completely covering the side surfaces of the light-transmissive portion; and an inner light-blocking portion which is in direct contact with either an upper surface or a lower surface of the light-transmissive portion extending from the side surfaces of the light-transmissive portion, and completely covering an entirety of the contacted upper or lower surface of the light-transmissive portion.

2. The foldable display device of claim 1,
wherein a light-transmittance of the inner light-blocking portion is greater than a light-transmittance of the outer light-blocking portion.

3. The foldable display device of claim 1, wherein the light-blocking portion includes a thermoplastic elastomer containing a pigment or dye that render a black color.

4. The foldable display device of claim 3, wherein the light-blocking portion includes a thermoplastic polyurethane containing a black pigment or dye.

5. The foldable display device of claim 3, wherein the light-blocking portion includes a thermoplastic polyurethane containing a red pigment or dye, a green pigment or dye, and a blue pigment or dye.

6. The foldable display device of claim 3, wherein a content of the pigment or dye contained in the outer light-blocking portion of the light-blocking portion is greater than a content of the pigment or dye contained in the inner light-blocking portion of the light-blocking portion.

7. The foldable display device of claim 6, wherein the content of the pigment or dye contained in the outer light-blocking portion of the light-blocking portion is in a range of 0.5 wt % to 5 wt %, and the content of the pigment or dye contained in the inner light-blocking portion of the light-blocking portion is in a range of 0.05 wt % to 2 wt %.

8. The foldable display device of claim 3, wherein the outer light-blocking portion of the light-blocking portion includes two layers having different contents of the pigment or dye.

9. The foldable display device of claim 1, wherein a thickness of the outer light-blocking portion of the light-blocking portion is greater than a thickness of the inner light-blocking portion of the light-blocking portion.

10. The foldable display device of claim 9, wherein a thickness of the outer light-blocking portion of the light-blocking portion is in a range of 50 μm to 120 μm, and the thickness of the inner light-blocking portion of the light-blocking portion is in a range of 0.5 μm to 10μ m.

11. The foldable display device of claim 1, wherein a thickness of the inner light-blocking portion of the light-blocking portion is less than a thickness of the light-transmissive portion.

12. The foldable display device of claim 1, wherein the multi-functional layer of the cover window assembly is directly coated on a lower surface of the protective film and is attached to an upper surface of the display panel via an adhesive layer.

13. The foldable display device of claim 1, wherein the cover window assembly further comprises:
- a cover window between the protective film and the multi-functional layer,
- wherein the multi-functional layer is directly coated on a lower surface of the cover window and is attached to an upper surface of the display panel via an adhesive layer.

14. A foldable display device comprising:
- a display panel including a light-emitting element, an encapsulation layer on the light-emitting element, and color filters on the encapsulation layer;
- a protective film on the display panel; and
- a multi-functional layer between the protective film and the display panel, and the multi-functional layer being attached to an upper surface of the display panel, the multi-functional layer including:
  - a light-transmissive portion having an area size that is smaller than an area size of the display panel; and
  - a light-blocking portion covering one of a lower surface and an upper surface of the light-transmissive portion, and side surfaces of the light-transmissive portion, the light-blocking portion having a light-transmittance that is less than a light-transmittance of the light-transmissive portion,
  - wherein the light-blocking portion comprises:
    - an outer light-blocking portion which is in direct contact with side surfaces of the light-transmissive portion, and completely covering the side surfaces of the light-transmissive portion; and
    - an inner light-blocking portion which is in direct contact with either an upper surface or a lower surface of the light-transmissive portion extending from the side surfaces of the light-transmissive portion, and completely covering an entirety of the contacted upper or lower surface of the light-transmissive portion.

15. The foldable display device of claim 14, wherein the light-blocking portion covers the lower surface and the side surfaces of the light-transmissive portion, and the light-transmissive portion directly contacts a lower surface of the protective film.

16. The foldable display device of claim 14, wherein the light-blocking portion covers the upper surface and the side surfaces of the light-transmissive portion, and the light-blocking portion directly contacts a lower surface of the protective film.

17. The foldable display device of claim 14, wherein the foldable display device further comprises:
- a cover window between the protective film and the multi-functional layer,
- wherein the light-blocking portion covers the lower surface and the side surfaces of the light-transmissive portion, and the light-transmissive portion directly contacts a lower surface of the cover window.

18. The foldable display device of claim 14, wherein the foldable display device further comprises:
- a cover window between the protective film and the multi-functional layer,
- wherein the light-blocking portion covers the upper surface and the side surfaces of the light-transmissive portion, and the light-blocking portion directly contacts a lower surface of the cover window.

19. The foldable display device of claim 14, wherein the light-blocking portion includes a thermoplastic elastomer containing a pigment or dye that render a black color.

20. The foldable display device of claim 19,
wherein a content of the pigment or dye contained in the outer light-blocking portion is greater than a content of the pigment or dye contained in the inner light-blocking portion.

* * * * *